(12) United States Patent
Weiss

(10) Patent No.: US 7,652,220 B2
(45) Date of Patent: Jan. 26, 2010

(54) SENSOR DEVICE

(75) Inventor: Josef Weiss, Deilingen (DE)

(73) Assignee: E.G.O. Elektro-Geraetebau GmbH, Oberderdingen (DE)

(*) Notice: Subject to any disclaimer, the term of this patent is extended or adjusted under 35 U.S.C. 154(b) by 0 days.

(21) Appl. No.: 11/506,412

(22) Filed: Aug. 17, 2006

(65) Prior Publication Data

US 2007/0051610 A1 Mar. 8, 2007

(30) Foreign Application Priority Data

Aug. 19, 2005 (DE) .................. 20 2005 013 420 U

(51) Int. Cl.
*H03K 17/975* (2006.01)

(52) U.S. Cl. .................................. 200/600

(58) Field of Classification Search ................ 200/600
See application file for complete search history.

(56) References Cited

U.S. PATENT DOCUMENTS

| 4,380,040 | A |   | 4/1983  | Posset              |
|-----------|---|---|---------|---------------------|
| 4,561,002 | A | * | 12/1985 | Chiu ........... 341/26 |
| 5,917,165 | A |   | 6/1999  | Platt et al.        |
| 6,667,563 | B2 | * | 12/2003 | Bae et al. ....... 307/112 |
| 6,723,937 | B2 | * | 4/2004  | Englemann et al. ....... 200/600 |
| 7,180,017 | B2 | * | 2/2007  | Hein ........... 200/5 R |
| 2001/0020578 | A1 | * | 9/2001 | Baier ........... 200/600 |
| 2004/0080486 | A1 |   | 4/2004  | Troxell et al.      |

FOREIGN PATENT DOCUMENTS

| DE | 1 299 749       |    | 7/1969  |
|----|-----------------|----|---------|
| DE | 201 19 700      | U1 | 3/2002  |
| DE | 102 15 209      | A1 | 12/2002 |
| FR | 2830999         | A1 | 4/2003  |
| GB | 2 234 352       | A  | 1/1991  |
| WO | WO 98/26506     |    | 6/1998  |
| WO | WO 03/052933    | A2 | 6/2003  |

OTHER PUBLICATIONS

German Search Report for DE 20 2005 013 420.1, dated Dec. 2, 2005.
European Search Report for European Application No. 06017104.8 dated Nov. 27, 2008.
Office Action from Chinese Application No. 200610172994.0 dated Jul. 24, 2009.

* cited by examiner

*Primary Examiner*—Michael A Friedhofer
*Assistant Examiner*—Lheiren Mae A Anglo
(74) *Attorney, Agent, or Firm*—Alston & Bird LLP

(57) ABSTRACT

A touch sensor device for a household appliance or the like is disclosed, for producing a signal for controlling the appliance's operation when touched by a user's finger. The sensor comprises a capacitance sensor element connected to control circuitry, wherein the sensor is connected to a first side of a circuit board, typically facing towards the inside of the appliance. In the same vicinity on the other side of the circuit board is a conductive field that is not galvanically connected to the sensor element, but which is positioned against a non-conductive panel, the other side of which forms the exterior of the appliance. The exterior surface of the panel is a touch area, so that contact by a user's finger in the touch area alters the capacitance, which is detected by the capacitance sensor element and is detected by the control circuitry for controlling the appliance.

13 Claims, 2 Drawing Sheets

SENSOR DEVICE

CROSS REFERENCE TO RELATED APPLICATIONS

This application claims priority from German Application No. 202005013420.1, which was filed Aug. 19, 2005 of which the contents are hereby incorporated by reference.

FIELD OF THE INVENTION

The invention is directed to a sensor device for producing a toggle signal when a switch zone is approached and/or touched.

BACKGROUND

The German Patent reference DE 30 36 050 C2 describes a capacitance system with a dielectric sheet, whereby the sensor exhibits an electrode located on one side of the sheet, which covers the same amount of space as the two electrodes located on the opposite side of the sheet; these two electrodes are shaped such that one encircles the other.

The European Patent reference EP 859 467 B1 describes a sensor device with a capacitance sensor element consisting of conductive foam, which is pressed onto the back side of a panel.

The German Patent reference DE 201 197 00 U1 describes a sensor device, for which an electric conductive layer is provided on the back side of a transparent panel that will be contacted via a contact component.

BRIEF DESCRIPTION OF THE FIGURES

Sample embodiments of the invention are schematically portrayed and will be described in more detail below. Shown in the figures.

DETAILED DESCRIPTION OF THE EMBODIMENTS

Figure 1:
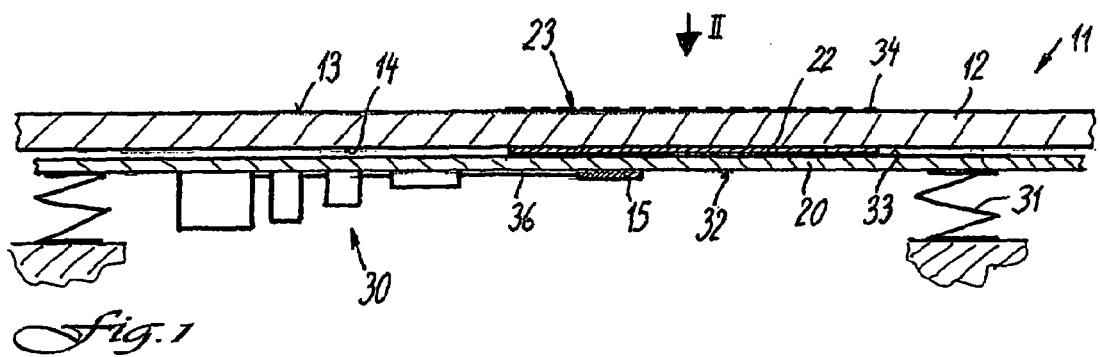
FIG. 1 illustrates a schematic cut through a sensor element.

An objective of the invention is to create a sensor device that provides a wide scope for the design of the components that are activated through proximity or touch, as well as those requiring a cover. The production of this sensor device should be cost-effective in large quantities, as well to easy to assemble.

This objective can be achieved by the characteristics of the independent claims herein. Advantageous, as well as preferable, configurations of the invention are the object of the other claims and will be hereafter further illustrated. The wording of the claims is part of the description.

No electrode or other conductive layer, which is especially electrically conductive outward, is required on the front side of the panel of this invention, i.e., on the outer side, or alternatively, on the outside of a household appliance. The panel does not need to be perforated or have openings, and can simply be equipped with a label for identifying the switch zone. The conductive field may be located on the back side of the panel, or alternatively may be located on the inward-facing side of the circuit board or circuit board, functions as a transmitting and toggle signal concentrative interlink, which also dimensionally defines and limits the switch zone. It is not electrically connected to the actual sensor surface. Advantageously, this can be positioned on back side of the circuit board that faces away from the panel.

The sensor element, which is, for example, a conductive layer that can be superimposed together with the contact paths, can also be substantially smaller than the conductive field which is located directly across from it on the circuit board. The sensor element can also have a totally different shape and/or lay dimensionally displaced beside it. This allows for greater freedom in how the components can be arranged on the circuit board. Space is saved due to the almost direct attachment of circuit board on the back side of the panel, while the concentration of all of the electrical constituents that need to be contacted on the side of the circuit board facilitates their production and assembly.

Since the electrically conductive field serves as a concentrator for the electrical field used for switching when approached, the usually layer-like or film-like component that constitutes the sensor can be any shape, even, for example, like a pictogram that displays the switching function. The image on the front side of the panel can correspond to this switching function. Nonetheless, the actual sensor element, located on the circuit board's side facing away from the panel, does not have to be shaped in the same manner, so that, for example, a standard shape of the circuit board can be used, even for the various shapes the switch. A shared circuit board can be applied for various switch zones on a panel or separate circuit boards can be affixed or contact the panel.

The electrically conductive field can be directly affixed to the circuit board with an electrically conductive material such as a carbon-based material, silver, copper or similar materials. For example, the conductive field could be a layer etched out through a negative operation, a supplemental small fitted disc, or a depression. It is also possible to affix a film cut-out, or the intermediate layer of a dielectric film, with conductive fields on it between the circuit board and the panel. One preferred embodiment involves the use of a two-sided adhesive film (double-sided adhesive band) that is used to simultaneously affix the electrically conductive field onto the circuit board or directly onto the panel, while also affixing the circuit board to the panel. Both the conductive fields as well as the sensor element itself are advantageous. The sensor element, constructed as an individual, continuous area requires no electrodes that surround one another that would need to be bridged together.

The electrically conductive field could also be elastic, especially elastic in volume, for example, and constructed using an electrically conductive foam in order to compensate for unevenness or curves between the panel and the circuit board.

Lighted buttons and other signal-emitting functions can be realized without perforating the panel. A light-emitting diode (LED) could be affixed to the side of the circuit board facing the panel. Or the LED could also be affixed to the other side, in order not to come into electrical contact with this side of the circuit board, and shine through a corresponding transparent surface of the panel through a perforation in the circuit board. Any desired illumination effect can be achieved through the use of several individual LEDs and a flat light-dispersion optic device. The electrically conductive field can be interrupted or alternatively, punctured using a grid structure or something similar. In this case, it is also possible to illuminate the direct button area through this field given that the panel is constructed to be accordingly translucent.

The conductive field is divided into two partial sections in a further, embodiment of the invention. These two partial sections are separated from each other and are connected with each other via a connecting section, which can, for example, be shaped like a bridge. Since the conductive field relays the touch signal from the switch zone with the applied finger to the sensor element, this relaying is shifted to the side, that is, from the first partial section on the switch zone to the second partial section above the sensor element. To this end, the second partial section is conveniently located across from the sensor element. The first conductive partial sector can be in a preferable location as it is separate from the sensor element and has not overlapping whatsoever, whereby the connecting section forms the electrical connection. Consequently, the distance between the two partial sections can be great; for example, the distance can amount to two to ten times the diameter of the sensor element or of the first partial section.

In another embodiment of the invention, the first partial section defines the switch zone, for which a label is provided on the panel above the first partial section. In the embodiment previously mentioned, the whole conductive field carried out this function. The switch zone can be as big as the first partial section. The size of the second partial section across from the sensor element should just about correspond with that of the sensor element, but does not need to be too much bigger.

Both of the partial sections and the connecting section are conveniently constructed as one single layer with different widths or alternatively, with a concurrent contour progression. This layer is conveniently affixed to the corresponding contour in a single process.

There are several conductive fields on the electrically insulated circuit board in a preferred embodiment of the sensor device. Each field is divided among different partial sections, that is, partial sections with connecting sections between them. In each case a sensor element belonging to a conductive field maybe located apart from the switch zone with the first partial section that is associated with it.

Since the conductive field is located both on the switch zone as well as on the sensor element, the previously described embodiment is designed in compliance with the general inventive concepts as claimed. However, the switch zone and field have been separated from one another or pulled apart, and are no longer one above the other in a layer composition. By pulling them apart, it is easier to vary the design and construction of the sensor device, especially on the panels of electric appliances. Consequently, the actual sensor element can now be far apart from the switch zone.

The preceding and further characteristics, aside from being based on demands, emanate from the description and figures. Protection is now claimed for the individual characteristics, each for itself or several together in combination, as embodiments of the invention and in other areas to which the invention could be applied as well as patentable versions of themselves that could possibly be portrayed.

Figure 2:
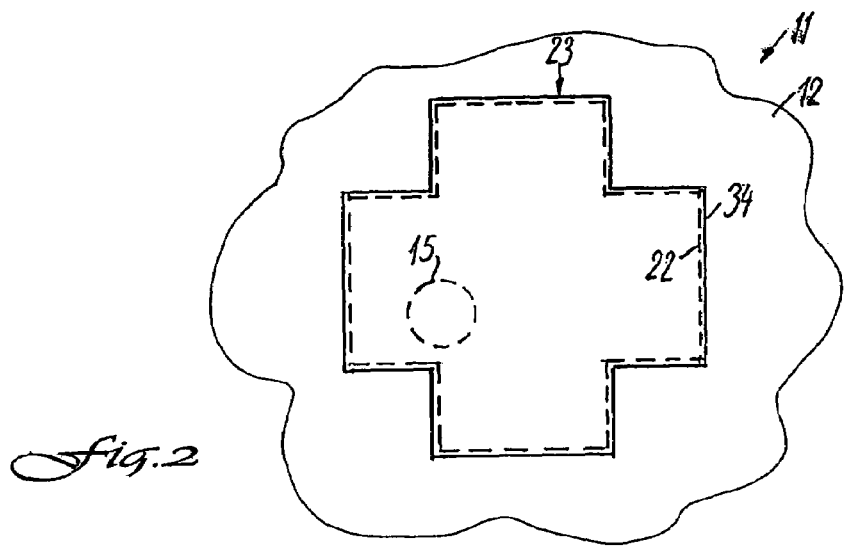
FIG. 2 illustrates an aerial view in the direction of arrow II of FIG. 1.

Turning now to the figures, the sensor device 11 portrayed in FIGS. 1 and 2 illustrates a capacitance touch switch that evaluates the capacitance change that occurs when a switch zone 23 of a panel 12 is approached or touched by a body such as the finger of a user. This evaluation is done through an electrical control system 30 (which are well known in the art) or by evaluating a switch operation. The functioning principle and the switch are disclosed in the documents initially mentioned. Incorporation by reference is made to them here.

The panel 12, of which only a small section is shown, consists of non-metallic, dielectric material, for instance, plastic, that can be opaque or translucent and is usually thermoplastic. It is not electrically conductive and can either form the front, or another part of the housing of an electric appliance, such as a washing machine, dishwasher, dryer, a similar household appliance, or an internally placed panel. The invention can, however, also be used for other appliances such as machine tools, switchboards, and still others. The panel 12 has a front side that faces the user 13 and a back side 14, upon which, for example, a circuit board 20 (also known as a printed circuit board) is pressed through springs 31. The circuit board 20 comprises electrically insulated material having control electronics 30 and their individual elements in a surface mounted device ("SMD") fitted, sustaining, active side 32 and an unfitted side 33 that is facing the panel 12. The unassembled side facing inward exhibits a sensor element 15 comprising an electrically conductive surface which, for example, is galvanically connected to the control system 30 via standard conducting paths 36. The sensor element itself can also comprise a two-dimensional part of a conducting path. The circuit board, in the example presented, does not need to be perforated, since neither anchor points nor interlayer connections are necessary due to the SMD-fitting. This facilitates and lessens the cost of the production of the circuit board and makes it less sensitive to malfunctions.

An electrically conductive field 22 is provided on the unfitted side 33 of the circuit board 20. It is located in the provided sensor element's section 15 on the other side of the circuit board 32, but is not required, as can be seen, to be centrally located for this purpose, nor does not it also have to be the same shape or size. On the contrary, the electrically conductive field 22 can be substantially bigger than the sensor element 15.

This electrically conductive field 22 can be affixed to the circuit board by way of a conducting path or in any other kind of method using adhesive bonding, imprinting or other techniques using conductive material. It is flatly installed both on the back side 14 of the panel as well as also on the unfitted side 33 of the circuit board and, as it can be very thin, does not hinder the installation of the rest of the circuit board piece on the panel 12. The lateral proportions have been greatly exaggerated in the figures so that they are recognizable.

The conductive field 22 limits and defines the switch zone that forms and conforms itself on the body side 13 of the panel. It can, for example, be shaped like a pictogram, or a symbol such as "+" or "O". It is sensible to provide a label 34 the front side 13 of the panel, for example, via imprinting, that somewhat corresponds with the shape and size of the conductive field. This is implied in FIG. 2 where the switch zone 23 is shaped like a "+". It can be seen that the label 43 is somewhat bigger than the field 22 located on the back side and that the sensor element or alternatively the contact surfaces 15 is substantially smaller and can lay next to it in a different way should this better serve the circuit board structure and assembly.

When a body part (e.g, a user's finger) nears the switch zone 23 the capacitance ratios of the sensor unit, which consists of the electrically conductive field 22 and the sensor element 15, are changed, whereby the field 22 transfers the capacitance concentrated outcome through the circuit board and to the sensor element 15. The field 22 functions as a concentrator for the signal.

Figure 3:
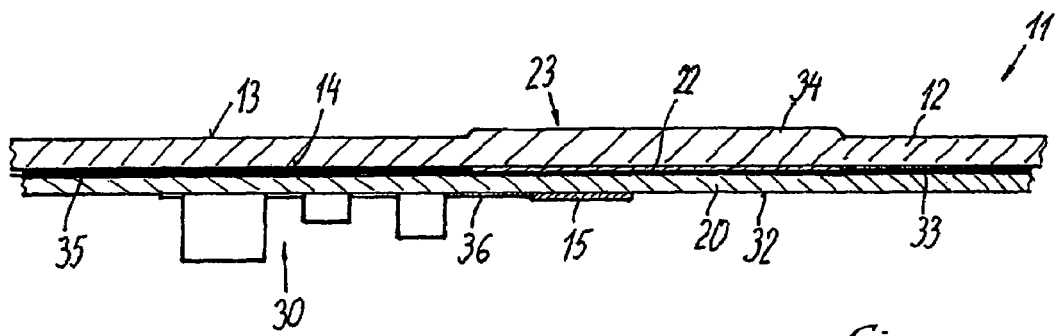
FIG. 3 illustrates a cross-sectional view of a sensor device of another embodiment corresponding to FIG. 1.

FIG. 3 shows an embodiment that, except for the previously explained differences, corresponds to the embodiment in FIG. 1 which will be referred to in this respect. Identical reference characters denote identical or functionally identical parts.

The attachment of the circuit board 20 to the panel 12 takes place in FIG. 3 via a double-sided, adhesive layer or group of layers 35, for instance, a double-adhesive film. It is affixed to the unfitted side 33 of the circuit board and there, affixed in the position described in FIG. 1 as a conductive field 22, is a small disc, for instance, a film cut-out. The circuit board, for the assembly of the electric appliance to which the panel 12 belongs, can be supplied in this version, which includes a removable cover. After pulling off the cover sheeting, which is not shown here, it is to be affixed to the back side of the panel 12, and to therewith affixed is also the conductive field in close contact to the back side 13 of the panel 12. This contact is important as an air gap could lead to a change in the capacitance qualities and to inaccuracies in the response characteristics of the electronic switch.

It is also possible to affix the conductive field 22 between the circuit board and the double-adhesive film 35 so that the whole adhesive surface can serve in affixing the panel.

In the embodiment shown in FIG. 3, the label 34 is formed by an elevation of the panel 12. It can also be seen that a central button illumination (not shown here) can be affixed using the packing between the conductive field 22 and the sensor element 15 in which a illumination diode (also not shown here) can be affixed to the fitted, active side 32 of the circuit board 20. This arrangement then displays the switch function through a hole in the circuit board and a corresponding transparent point on the panel.

Figure 4:
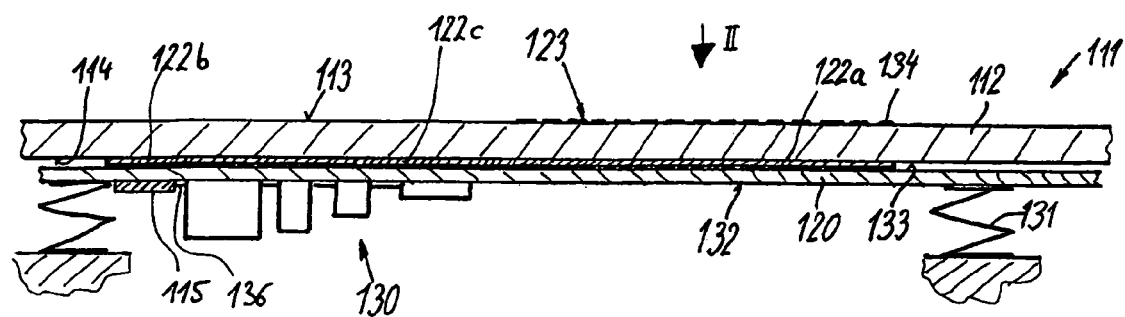
FIG. 4 illustrates another embodiment of the sensor device from FIG. 1 with a an elongated conductive field.
Figure 5:
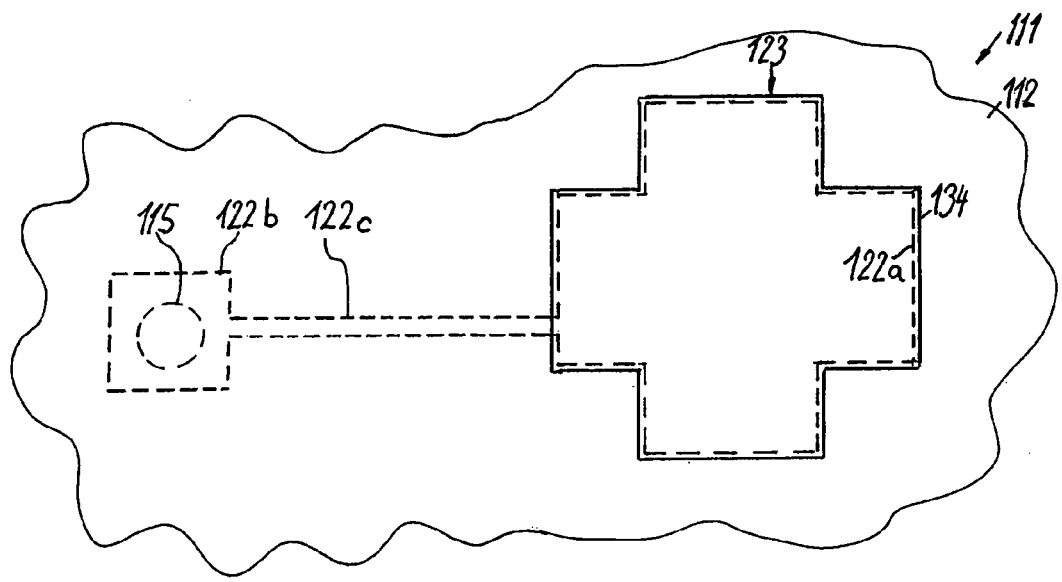
FIG. 5 illustrates the aerial view of the corresponding embodiment of FIG. 4.

The sensor device 111 portrayed from the side view in FIG. 4 and from an aerial view in FIG. 5 is another embodiment of that shown in FIGS. 1 and 2. It also is also used in conjunction with a capacitance touch switch that evaluates the change of capacitance due to a user's finger approaching near to or touching a switch zone 123 of a panel 112 with an electronic control system 130 or switch to accomplishing a switching process. The functional principle and the control system have been previously described.

Here, in contrast to the other embodiment, the field 22 is divided into a first partial section 122a which is affixed to the switch zone 123 or alternatively, the label 134 on the unfitted side 133 of the circuit board 120. The first partial section 122a runs across the connecting section 122c which is elongated, narrow and constructed sort of like a bridge or a conducting path. The connecting section leads away from the switch zone 123 to the left and goes over a second partial section 122b. This second partial section 122b is located above the sensor element 115 which is, in turn, constructed and connected to the control system 130 as previously described. The three sections 122a, 122b and 122c are formed by a single layer and are shaped or contoured according to FIG. 5.

In this embodiment, the signal or signal change that is produced by a touch is sent from the switch zone 123 to the first partial section 122a. There, the signal is transferred from the connecting section 122c to the second partial section 122b. The second partial section 122b transfers the capacitance outcome then, in turn, concentrated through the circuit board 120 to the sensor element 115. So the field functions as a concentrator for the signal to switch zone 123 just like in the previous embodiment. It is simply transferred within the field 122 (or rather within the partial sections of the signal laterally away from the switch zone 123) all the way to the distantly located sensor element 115. The aforementioned sensor unit continues to be formed by the field 122 and the sensor element only with two partial signal transmissions, so to speak. This embodiment is especially advantageous when several switch zones 123 are present, perhaps even very close together.

There is more flexibility for the design and arrangement of the sensor elements when they don't have to be arranged directly under the switch zones.

The invention claimed is:

1. A sensor device for use in a household appliance producing a toggle signal when a switch zone is touched with a user's finger, the sensor device comprising:
    a capacitance sensor element that is electrically connected with an electrical control system;
    a panel made from a non-metallic material having a front side and a back side, the front side facing the user and the back side facing away from the user;
    an electrically insulated circuit board positioned parallel to the panel and adjacent to the back side of the panel, the circuit board having a front side facing the back side of the panel and a back side and wherein the sensor element is mounted on the back side of the circuit board, wherein the circuit board is affixed to the panel; and
    a conductive field affixed to the front side of the circuit board and not electrically connected to the sensor element, whereby the conductive field defines the switch zone, wherein the surface area comprising the switch zone is different than the surface area comprising the sensor element.

2. The sensor device of claim 1 wherein the surface area of the switch zone is substantially larger than the surface area of the sensor element.

3. The sensor device of claim 1 wherein the surface area of the conductive field is larger than the surface area of the sensor element.

4. The sensor device of claim 1 wherein the capacitance sensor element is displaced to the side relative to the conductive field.

5. The sensor device of claim 1 wherein the conductive field has a shape corresponding to a label on the panel.

6. A sensor device for the production of a toggle signal for controlling an appliance when a switch zone is touched by a user's finger, the sensor device comprising;
    an electrical control system producing the toggle signal;
    a capacitance sensor element that is electrically connected with the electrical control system;
    a panel constructed from a non-metallic material having a front side facing the user and a back side, wherein the switch zone is located in an area on the front side;
    an electrically insulated circuit board upon having a front side facing the panel and a back side, wherein the sensor element is located on the back side of the circuit board, wherein the circuit board is positioned parallel to the panel and adjacent to the back side of the panel;
    a conductive field affixed to the front side of the circuit board wherein the conductive field is not electrically connected to the sensor element wherein the conductive field comprises a first partial section and a second partial section whereby the first partial section is located apart from the second partial section and electrically connected to each other by way of a connecting section.

7. The sensor element of claim 6 wherein the second partial section is located on the front side of the circuit board opposite from the location of the sensor element on the back side of the circuit board, and the first partial section is located on the front side of the circuit board such that it does not overlap the location of the sensor element.

8. The sensor element of claim 6 wherein the distance from the edge of the first partial section and the edge of the sensor element is within the range of two to ten times the widest portion of the sensor element of the first partial section.

9. The sensor element of claim 6 wherein the first partial section defines the switch zone and a label is provided on the front side of the panel in the vicinity of the first partial section.

10. The sensor device of claim 6 wherein the first partial section, second partial section and the connecting section are made from a single layer and the shape of both the first partial section and the second partial section is different from the connecting section.

11. The sensor device according to claim 6 comprising a plurality of switch zones and a plurality of respective conductive fields, each having a respective one of a plurality of sensor elements located on the printed circuit board.

12. The sensor device of claim 6 wherein the circuit board is affixed to the panel in an area opposite from the area of the switch zone on the front side of the panel.

13. A household appliance having a sensor element for controlling operation of the appliance in response in response to a touch by a user's finger in a touch area comprising;

a panel made from non-metallic material having a front side and a back side, the front side having indicia defining the touch area and for receiving the touch of the user's finger;

a circuit board affixed to the panel, the circuit board having a front side and a back side, the front side having affixed thereto a conductive field having a first surface area, the back side having affixed a capacitance sensor element having a second surface area, wherein the conductive field and the capacitance sensor element are not electrically connected, wherein said first surface area is different from said second surface area and wherein the capacitance sensor element is located opposite from the conductive field; and a controller for detecting a change in capacitance as a result of the touch of the user's finger in the touch area.

* * * * *